(12) United States Patent
Sakai et al.

(10) Patent No.: US 11,435,509 B2
(45) Date of Patent: Sep. 6, 2022

(54) OPTICAL STACK INCLUDING MULTIPLE OPTICAL LAYERS, DISPLAY DEVICE INCLUDING THE OPTICAL STACK DISPOSED ON A PANEL, AND METHOD FOR PRODUCING OPTICAL STACK

(71) Applicant: Sharp Kabushiki Kaisha, Osaka (JP)

(72) Inventors: Akira Sakai, Osaka (JP); Masahiro Hasegawa, Osaka (JP); Miho Yamada, Osaka (JP); Kiyoshi Minoura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/666,596

(22) Filed: Oct. 29, 2019

(65) Prior Publication Data

US 2020/0132905 A1    Apr. 30, 2020

Related U.S. Application Data

(60) Provisional application No. 62/752,502, filed on Oct. 30, 2018.

(51) Int. Cl.
    *G02B 5/30*     (2006.01)
    *G06F 3/041*    (2006.01)
    *H01L 27/32*    (2006.01)
    *H01L 51/52*    (2006.01)

(52) U.S. Cl.
    CPC .......... *G02B 5/3016* (2013.01); *G06F 3/041* (2013.01); *H01L 27/323* (2013.01); *H01L 51/5293* (2013.01)

(58) Field of Classification Search
    CPC ........ G02B 5/3016; G02B 5/305; G02B 1/14; G06F 3/041; G06F 3/0412; G06F 2203/04103; H01L 27/323; H01L 51/5293; H01L 51/5262; H01L 51/524; H01L 51/5281
    See application file for complete search history.

(56) References Cited

U.S. PATENT DOCUMENTS

| | | | |
|---|---|---|---|
| 2002/0140882 A1* | 10/2002 | Kitagawa | G02F 1/133528 349/96 |
| 2003/0090012 A1* | 5/2003 | Allen | G02F 1/133536 264/1.31 |
| 2006/0233970 A1* | 10/2006 | Takahashi | G02F 1/133632 428/1.1 |

(Continued)

FOREIGN PATENT DOCUMENTS

| | | |
|---|---|---|
| CN | 105524567 A | 4/2016 |
| CN | 106318282 A | 1/2017 |

(Continued)

*Primary Examiner* — David D Davis
(74) *Attorney, Agent, or Firm* — Renner, Otto, Boisselle & Sklar, LLP

(57) ABSTRACT

An optical stack for a display device includes multiple layers that are incorporated into a display device that further includes a display panel. The optical stack includes a resin layer, an alignment film, an optical compensation layer, a polarizer, and a hard coat layer that are stacked in this order from a panel side. The optical stack is formed by preparing and coating a solution for each layer, and then curing and otherwise treating each layer as warranted for a particular layer, in turn to form the optical stack.

8 Claims, 11 Drawing Sheets

(56) References Cited

U.S. PATENT DOCUMENTS

| | | | |
|---|---|---|---|
| 2009/0244412 A1* | 10/2009 | Tsukagoshi | G02B 5/3016 349/8 |
| 2012/0026126 A1* | 2/2012 | Park | G06F 3/0443 345/174 |
| 2013/0169597 A1* | 7/2013 | Yin | G06F 3/041 345/175 |
| 2014/0313440 A1* | 10/2014 | Hsu | G06F 3/0446 349/12 |
| 2015/0129852 A1* | 5/2015 | Park | H01L 27/3213 257/40 |
| 2016/0109631 A1 | 4/2016 | Mizutani et al. | |
| 2016/0349883 A1* | 12/2016 | Kiyoto | G06F 3/0446 |
| 2018/0329125 A1 | 11/2018 | Hikita et al. | |

FOREIGN PATENT DOCUMENTS

| | | | |
|---|---|---|---|
| JP | 2006058517 A | * | 3/2006 |
| JP | 2010026529 A | * | 2/2010 |
| JP | 2017-102443 | | 6/2017 |

* cited by examiner

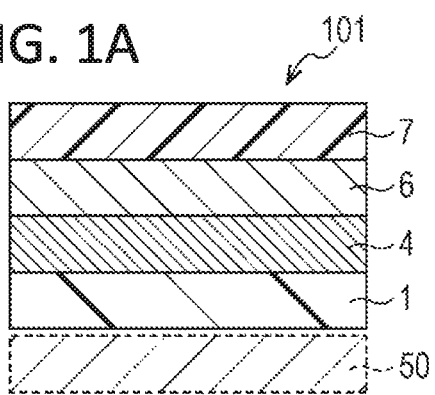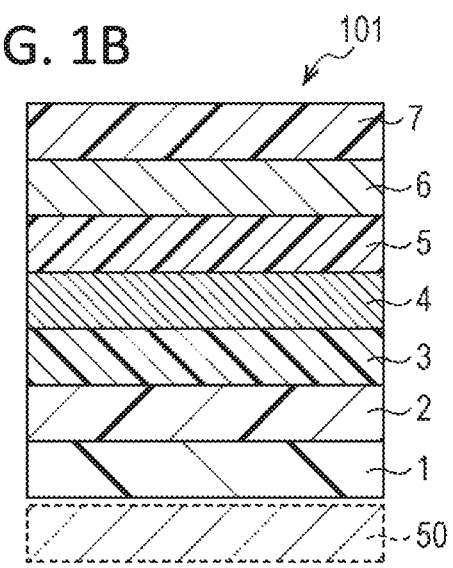

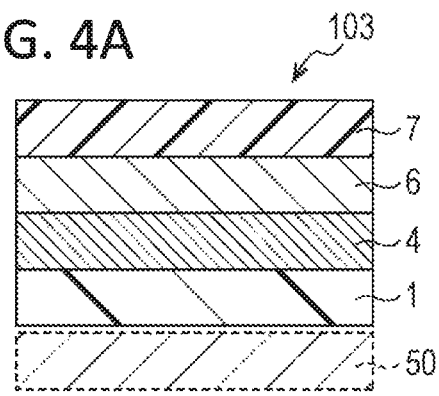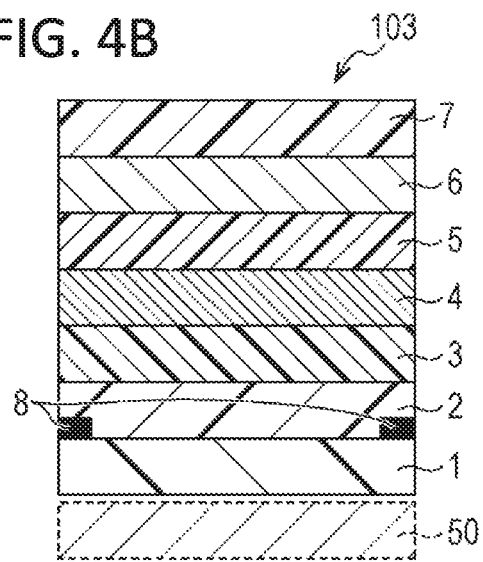

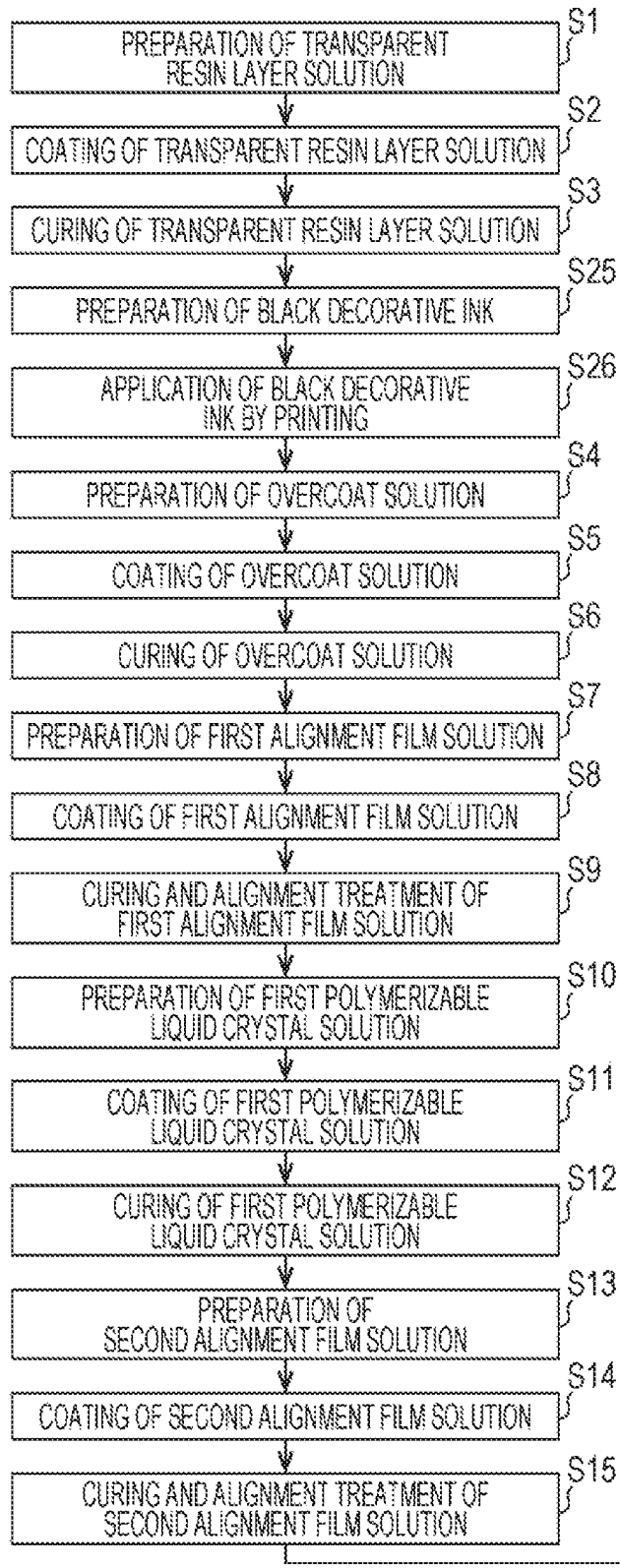
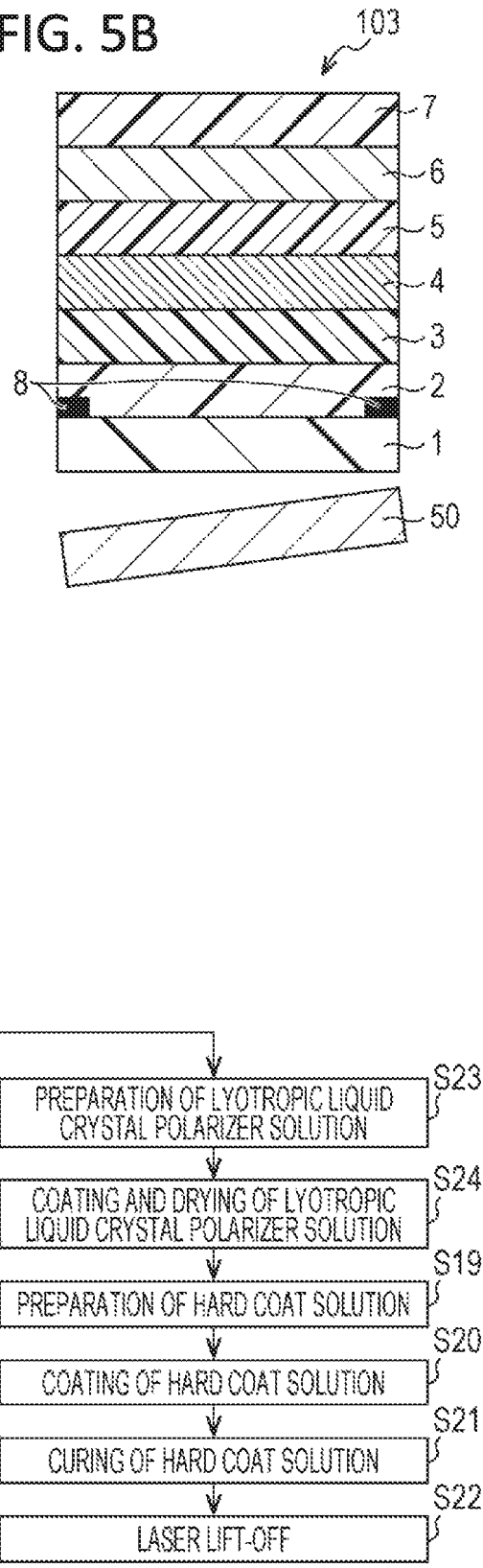

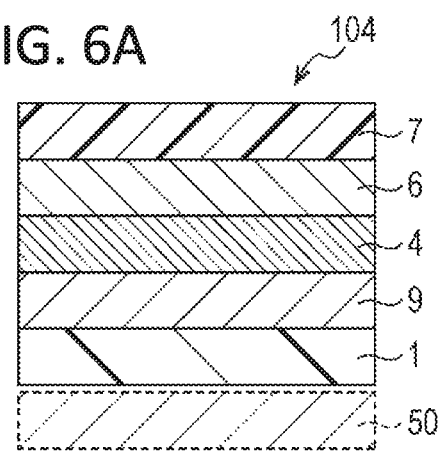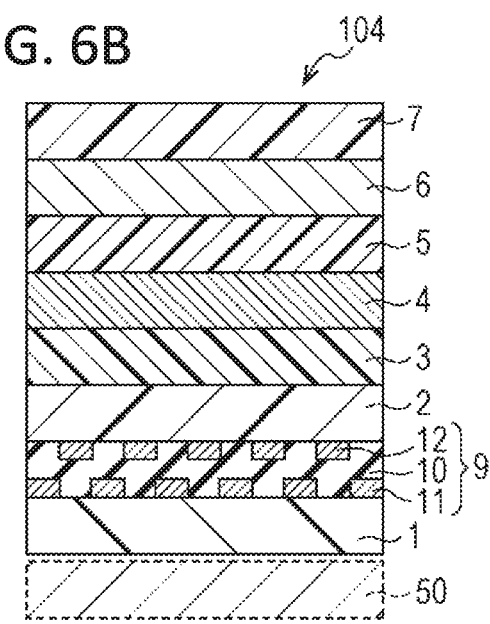
FIG. 6A
FIG. 6B

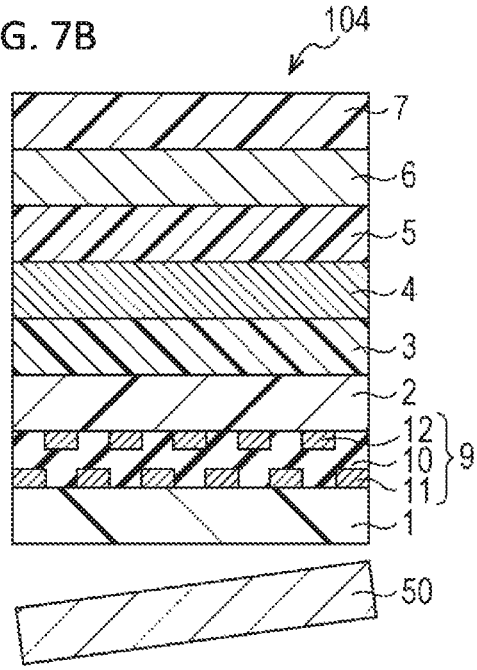

FIG. 7B

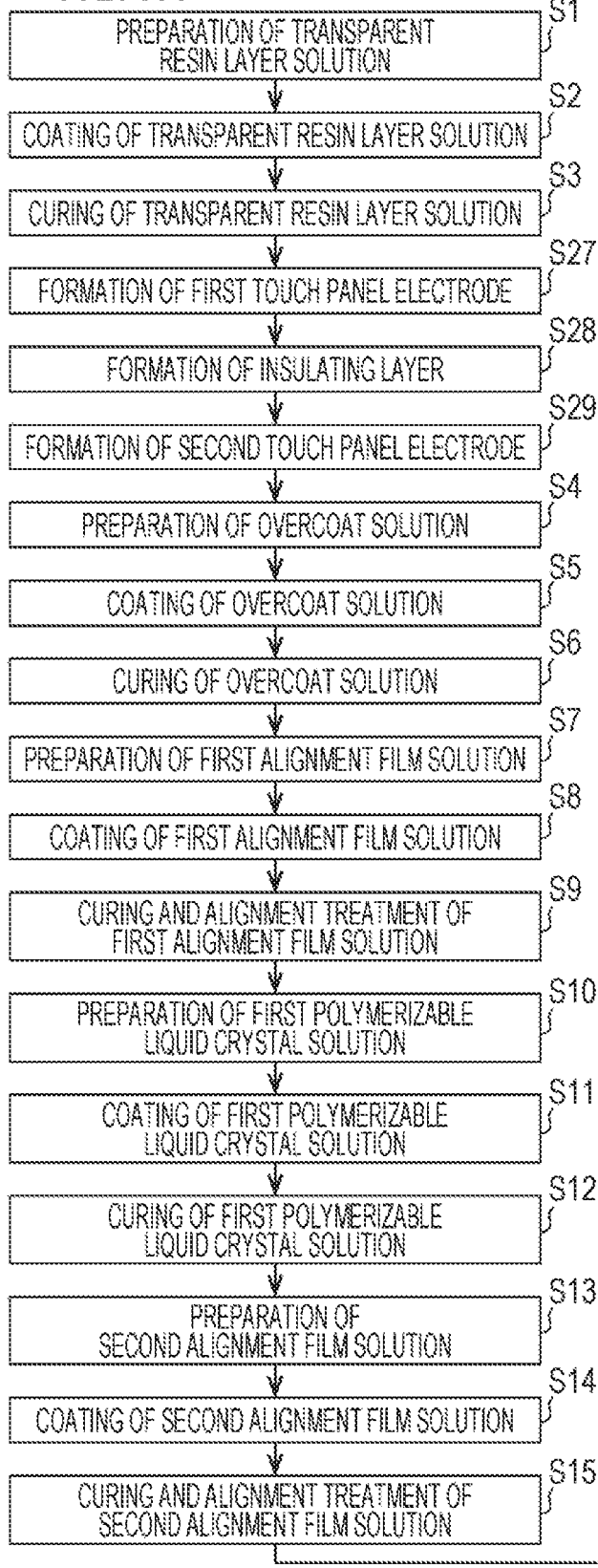

FIG. 7A

| Step | Description |
|---|---|
| S1 | PREPARATION OF TRANSPARENT RESIN LAYER SOLUTION |
| S2 | COATING OF TRANSPARENT RESIN LAYER SOLUTION |
| S3 | CURING OF TRANSPARENT RESIN LAYER SOLUTION |
| S27 | FORMATION OF FIRST TOUCH PANEL ELECTRODE |
| S28 | FORMATION OF INSULATING LAYER |
| S29 | FORMATION OF SECOND TOUCH PANEL ELECTRODE |
| S4 | PREPARATION OF OVERCOAT SOLUTION |
| S5 | COATING OF OVERCOAT SOLUTION |
| S6 | CURING OF OVERCOAT SOLUTION |
| S7 | PREPARATION OF FIRST ALIGNMENT FILM SOLUTION |
| S8 | COATING OF FIRST ALIGNMENT FILM SOLUTION |
| S9 | CURING AND ALIGNMENT TREATMENT OF FIRST ALIGNMENT FILM SOLUTION |
| S10 | PREPARATION OF FIRST POLYMERIZABLE LIQUID CRYSTAL SOLUTION |
| S11 | COATING OF FIRST POLYMERIZABLE LIQUID CRYSTAL SOLUTION |
| S12 | CURING OF FIRST POLYMERIZABLE LIQUID CRYSTAL SOLUTION |
| S13 | PREPARATION OF SECOND ALIGNMENT FILM SOLUTION |
| S14 | COATING OF SECOND ALIGNMENT FILM SOLUTION |
| S15 | CURING AND ALIGNMENT TREATMENT OF SECOND ALIGNMENT FILM SOLUTION |

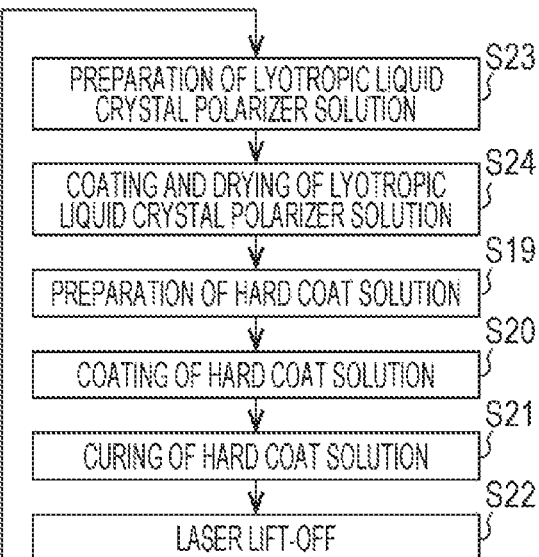

| Step | Description |
|---|---|
| S23 | PREPARATION OF LYOTROPIC LIQUID CRYSTAL POLARIZER SOLUTION |
| S24 | COATING AND DRYING OF LYOTROPIC LIQUID CRYSTAL POLARIZER SOLUTION |
| S19 | PREPARATION OF HARD COAT SOLUTION |
| S20 | COATING OF HARD COAT SOLUTION |
| S21 | CURING OF HARD COAT SOLUTION |
| S22 | LASER LIFT-OFF |

FIG. 11

| | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 |
|---|---|---|---|---|---|---|---|
| THICKNESS (μm) | 35 | 33 | 52 | 75 | 35 | 790 | 40 |
| FLEXIBILITY | ○ | ○ | ○ | ○ | ○ | × | ○ |
| ADDITIONAL FUNCTION | | | DECORATIVE PRINT | TOUCH PANEL | | | |
| APPEARANCE QUALITY (SPECULARITY) | ○ | ○ | ○ | ○ | ○ | ○ | × |

OPTICAL STACK INCLUDING MULTIPLE OPTICAL LAYERS, DISPLAY DEVICE INCLUDING THE OPTICAL STACK DISPOSED ON A PANEL, AND METHOD FOR PRODUCING OPTICAL STACK

CROSS-REFERENCE TO RELATED APPLICATIONS

The present application claims priority under 35 U.S.C. § 119 to U.S. Provisional Application No. 62/752,502 filed on Oct. 30 2018, the contents of which are incorporated herein by reference in their entirety.

BACKGROUND OF THE INVENTION

Field of the Invention

The present invention relates to an optical stack, a display device, and a method for producing an optical stack.

Description of Related Art

Display devices typified by OLED (organic light-emitting diode) display devices and liquid crystal display devices have been required to be flexible. Examples of flexible display devices include those that can be curved, those that are foldable, and those that can be wound. Substantially no flexible display device has been commercialized because of problems (1) and (2) below.

(1) A cover glass is often disposed as a protective layer on a surface of the panel of a display device. The cover glass usually has a thickness of about 0.5 mm to about 2 mm and has almost no flexibility. Thus, the cover glass hinders the display device from being flexible.

(2) In particular, OLED display devices do not require members such as backlights and are advantageous in terms of a reduction in thickness. Expectations for flexible display devices are running high. Meanwhile, internal reflection in panels of OLED display devices is very large because metal materials are used for cathodes of OLED display devices. As a countermeasure against this internal reflection, circular polarizers need to be disposed in OLED display devices. A typical circular polarizer includes a film-like linear polarizer and a film-like $\lambda/4$ wave plate. The film-like linear polarizer is formed by drawing a PVA (polyvinyl alcohol)-based film impregnated with a dichroic pigment such as iodine and typically has a thickness of about 5 µm to about 50 µm. The film-like $\lambda/4$ wave plate is formed by drawing a film composed of a polycarbonate resin or a cycloolefinic polymer resin and typically has a thickness of about 30 µm to about 100 µm. That is, the film-like linear polarizer and the film-like $\lambda/4$ wave plate each have a certain degree of thickness and thus hinder such an OLED display device from being flexible.

To particularly solve problem (1), a technique for using what is called a window film serving as an alternative to the cover glass has been studied. The window film is a film composed of a resin layer and a hard coat layer. As an example of the technique, Patent Literature 1 discloses an optical stack in which an optical compensation layer capable of functioning as a $\lambda/4$ wave plate, a polarizer, a resin layer, and a surface protective layer formed of a hard coat layer are stacked in this order.

[PTL 1] Japanese Unexamined Patent Application Publication No. 2017-102443 (made public on Jun. 8, 2017)

The surface protective layer disclosed in Patent Literature 1 is formed by forming a resin into a long rolled resin layer and applying the hard coat layer to the long resin layer in roll form. The optical stack disclosed in Patent Literature 1 is produced as follows: Each of the polarizer and the optical compensation layer is formed into a roll. Then the surface protective layer, the polarizer, and the optical compensation layer are stacked in a roll-to-roll manner.

From the above, in order to produce the optical stack disclosed in Patent Literature 1, a manufacturing apparatus suitable for handling a long rolled resin film is needed. Accordingly, for a manufacturer that does not have the manufacturing apparatus, there is a problem that it is difficult to manufacture the optical stack disclosed in Patent Literature 1.

The method for manufacturing an optical stack disclosed in Patent Literature 1 described above is suitable for mass production of the optical stack, but is not suitable for individual production of the optical stack. For example, in the case where an optical stack is subjected to decorative printing, the contents of the printing need to be changed in accordance with an electronic apparatus on which a display device is mounted. According to the manufacturing method, it is difficult to perform decorative printing individually for many optical stacks in the course of the manufacturing process of optical stacks. Thus, there is a problem that the manufacturing method is not suitable for individual production of the optical stack.

An aspect of the present invention aims to provide an optical stack easily produced, a display device, and a method for producing an optical stack.

Additionally, an aspect of the present invention aims to provide a method for producing an optical stack, the method being suitable for individual production.

BRIEF SUMMARY OF THE INVENTION (1) According to an embodiment of the present invention, an optical stack disposed on the panel of a display device includes a resin layer, an optical compensation layer, a polarizer, and a hard coat layer stacked in this order from a panel side.

(2) In the optical stack according to an embodiment of the present invention, the polarizer contains a lyotropic liquid crystal material, in addition to the configuration described in (1).

(3) The optical stack according to an embodiment of the present invention further includes a decorative print in accordance with the type of electronic apparatus on which the display device is mounted, the decorative print being formed between the resin layer and the hard coat layer, in addition to the configuration described in (1) or (2).

(4) The optical stack according to an embodiment of the present invention further includes an electrode to drive a touch panel, the electrode being disposed between the resin layer and the optical compensation layer, in addition to the configuration described in any of (1) to (3).

(5) According to an embodiment of the present invention, a display device includes a panel and the optical stack described in any of (1) to (4), the optical stack being disposed on the panel.

(6) According to an embodiment of the present invention, a display device includes a panel, a touch panel, and the optical stack described in (4), the optical stack being disposed on the panel, the touch panel being driven by the electrode disposed in the optical stack.

(7) According to an embodiment of the present invention, a method for producing an optical stack disposed on a panel of a display device includes the steps of stacking a resin layer, an optical compensation layer, a polarizer, and a hard coat layer in this order from a panel side.

(8) In the method for producing an optical stack according to an embodiment of the present invention, before providing the hard coat layer, decorative printing is performed on or above the resin layer in accordance with the type of electronic apparatus on which the display device is mounted, in addition to the configuration described in (7).

(9) In the method for producing an optical stack according to an embodiment of the present invention, before providing the optical compensation layer, an electrode to drive a touch panel is disposed on or above the resin layer, in addition to the configuration described in (7) or (8).

(10) The method for producing an optical stack according to an embodiment of the present invention further includes the steps of disposing the resin layer on a glass substrate and, after providing the hard coat layer, peeling the resin layer from the glass substrate, in addition to the configuration described in any of (7) to (9).

According to an embodiment of the present invention, it is possible to provide an optical stack easily produced, a display device, and a method for producing an optical stack.

According to an embodiment of the present invention, it is possible to provide a method for producing an optical stack, the method being suitable for the individual production of the optical stack.

BRIEF DESCRIPTION OF THE DRAWINGS

FIG. 1A and FIG. 1B are each a cross-sectional view illustrating the structure of an optical stack according to a first embodiment of the present invention; FIG. 1A illustrates a schematic structure, and FIG. 1B illustrates a specific structure.

FIG. 4A and FIG. 4B are each a cross-sectional view illustrating the structure of an optical stack according to a third embodiment of the present invention; FIG. 4A illustrates a schematic structure, and FIG. 4B illustrates a specific structure.

FIG. 5A is a flow chart illustrating a method for producing an optical stack according to the third embodiment of the present invention, and FIG. 5B is a schematic view illustrating the peeling of a resin layer of the optical stack from a glass substrate.

FIG. 6A and FIG. 6B are each a cross-sectional view illustrating the structure of an optical stack according to a fourth embodiment of the present invention; FIG. 6A illustrates a schematic structure, and FIG. 6B illustrates a specific structure.

FIG. 7A is a flow chart illustrating a method for producing an optical stack according to the fourth embodiment of the present invention, and FIG. 7B is a schematic view illustrating the peeling of a resin layer of the optical stack from a glass substrate.

FIG. 8A illustrates a schematic structure, and FIG. 8B illustrates a specific structure.

FIG. 9A illustrates a schematic structure, and FIG. 9B illustrates a specific structure.

FIG. 11 is a table presenting the thickness, the flexibility, the additional function, and the appearance quality (specularity) of the optical stacks according to the embodiments and the comparative examples of the present invention.

DETAILED DESCRIPTION OF THE INVENTION

Figure 2A:
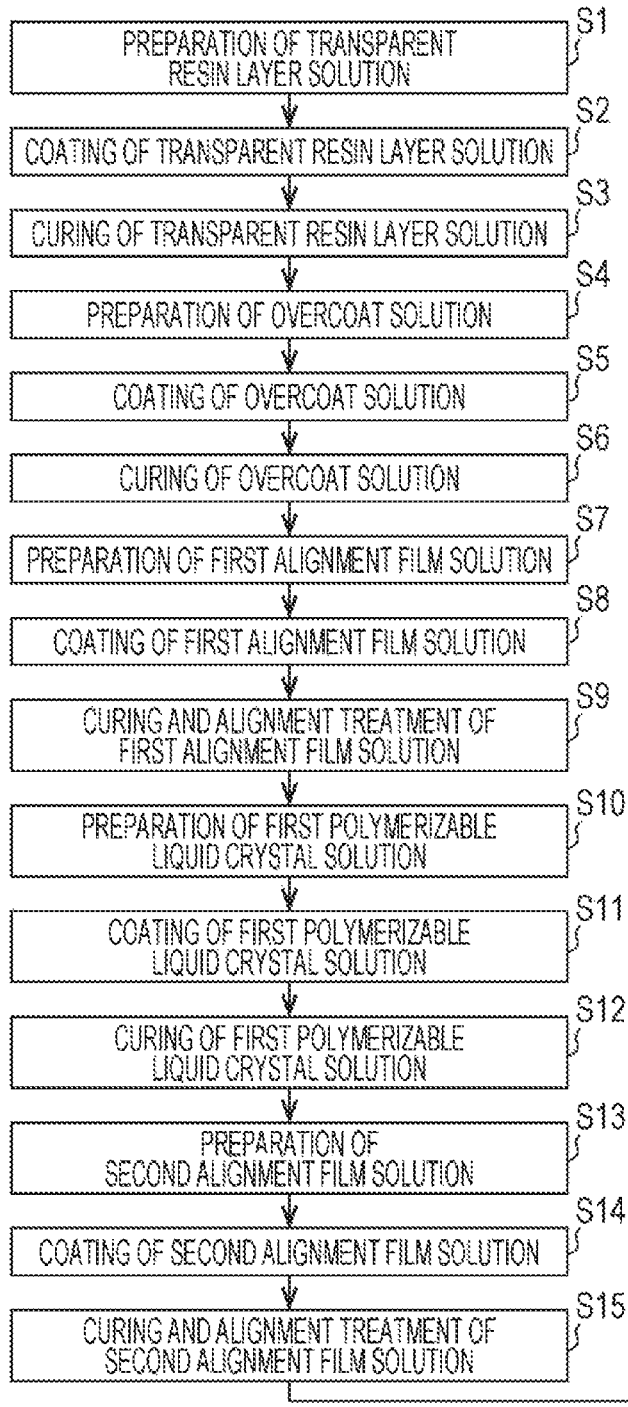
FIG. 2A is a flow chart illustrating a method for producing an optical stack according to the first embodiment of the present invention.

Embodiments for carrying out the present invention will be described below with reference to FIGS. 1 to 13. For convenience of explanation, members having the same functions as those described earlier are denoted by the same reference numerals, and the description is not repeated, in some cases.

First Embodiment (a) and (b) of FIG. 1 are each a cross-sectional view illustrating a structure of an optical stack 101 according to a first embodiment of the present invention, (a) illustrates a schematic structure, and (b) illustrates a specific structure.

The optical stack 101 is an optical stack disposed on the panel of a display device and includes a resin layer 1, an optical compensation layer 4, a polarizer 6, and a hard coat layer 7 stacked in this order from the panel side. More specifically, the resin layer 1, an overcoat layer 2, an alignment film 3, the optical compensation layer 4, an alignment film 5, the polarizer 6, and the hard coat layer 7 are stacked in this order. The optical stack 101 is produced in a state in which a surface of the resin layer 1 opposite to the surface adjacent to the optical compensation layer 4 is mounted on a glass substrate 50. In other words, the optical stack 101 is produced in a state in which the resin layer 1 is disposed on the glass substrate 50. The glass substrate 50 is indicated by a broken line in FIG. 1 because it is used only in producing the optical stack 101 and is not left in the final product of the optical stack 101.

Figure 2B:
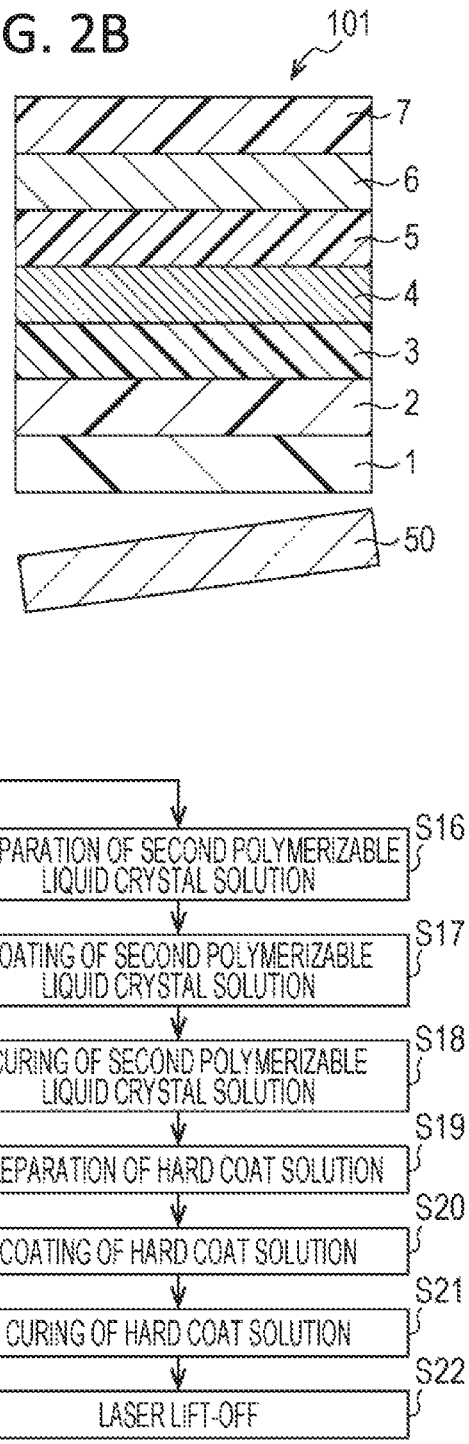
FIG. 2B is a schematic view illustrating the peeling of a resin layer of the optical stack from a glass substrate.

(a) of FIG. 2 is a flow chart illustrating a method for producing the optical stack 101, and (b) of FIG. 2 is a schematic view illustrating the peeling of the resin layer 1 of the optical stack 101 from the glass substrate 50.

First, a transparent polyimide film is formed on the glass substrate 50. A polyimide polymer varnish (transparent resin layer solution) is prepared by applying a known polyimide synthesis technique (step S1). Subsequently, the varnish is applied to the glass substrate 50 by a known coating technique such as slit coating or spin coating to form a coating film (step S2). Next, the coating film is dried to remove the solvent and baked to form a polyimide-based film. The polyimide-based film is defined as the resin layer 1 (step S3).

The resin layer 1 functions as a base material (support material) in the optical stack 101.

Subsequently, the overcoat layer 2 for protection is formed on the resin layer 1. The purpose of disposing the overcoat layer 2 is to prevent the resin layer 1 composed of a polyimide-based material from being damaged by the alignment film 3 (polyimide-based) formed later. As a material for the overcoat layer 2 (overcoat solution), an acrylic ultraviolet curable resin or the like can be used (step S4). The acrylic ultraviolet curable resin or the like is applied to the resin layer 1 by a known coating technique such as slit coating or spin coating (step S5) to form a coating film. Next, the coating film is dried to remove the solvent and is sequentially subjected to preliminary baking, ultraviolet irradiation, and main baking to form the overcoat layer 2 (step S6).

Subsequently, the alignment film 3 is formed on the overcoat layer 2. As a material for the alignment film 3 (first alignment film solution), a known polyimide or the like can be used (step S7). The polyimide or the like is applied to the overcoat layer 2 by a known coating technique such as alit coating, spin coating, or printing to form a coating film (step S8). Next, the coating film is dried to remove the solvent and is sequentially subjected to preliminary baking and main baking to form the alignment film 3. The alignment film 3 is further subjected to alignment treatment to exhibit a function as an alignment film. As the alignment treatment, known treatment such as rubbing treatment or polarized ultraviolet irradiation (photo-alignment) treatment can be appropriately selected. The timing of the alignment treatment may be after completion of the alignment film 3 (that is, after the main baking) or between the temporary baking and the main baking. The optimum timing of the alignment process may vary depending on the material of the alignment film 3 (step S9).

Subsequently, the optical compensation layer 4 is formed on the alignment film 3. As a material for the optical compensation layer 4, a polymerizable liquid crystal (first polymerizable liquid crystal solution) or the like can be used (step S10). The polymerizable liquid crystal or the like is applied to the alignment film 3 by a known coating technique such as slit coating, spin coating, or printing to form a coating film (step S11). Next, the solvent is removed from the coating film. Preliminary baking, ultraviolet irradiation, and main baking are sequentially performed to form the optical compensation layer 4 (step S12). The optical compensation layer 4 functions as a λ/4 wave plate.

Subsequently, the alignment film 5 is formed on the optical compensation layer 4. As a material for the alignment film 5 (second alignment film solution), the same material as that for the alignment film 3 may be used (step S13). The material is applied to the optical compensation layer 4 by a known coating technique such as slit coating, spin coating, or printing to form a coating film (step S14). Next, the coating film is dried to remove the solvent and is sequentially subjected to preliminary baking and main baking to form the alignment film 5. The alignment film 5 is further subjected to alignment treatment to exhibit a function as an alignment film. Regarding the alignment treatment, the same thing as the alignment treatment for the alignment film 3 is true (step S15).

Subsequently, the polarizer 6 is formed on the alignment film 5. As a material for the polarizer 6, a dichroic pigment-containing polymerizable liquid crystal (second polymerizable liquid crystal solution) or the like can be used (step S16). The material is applied to the alignment film 5 by a known coating technique such as slit coating, spin coating, or printing to form a coating film (step S17). Next, the solvent is removed from the coating film and is sequentially subjected to preliminary baking, ultraviolet irradiation, and main baking to form the polarizer 6 (step S18). The polarizer 6 functions as a linear polarizer. The optical compensation layer 4 and the polarizer 6 are disposed as countermeasures against internal reflection in the panel of a display device (in particular, an OLED display device) including the optical stack 101.

Subsequently, the hard coat layer 7 is formed on the polarizer 6. A material for the hard coat layer 7 (hard coat solution), an acrylic ultraviolet curable resin or the like can be used (step S19). The acrylic ultraviolet curable resin or the like is applied to the polarizer 6 by a known coating technique such as slit coating or spin coating to form a coating film (step S20). Next, the coating film is dried to remove the solvent and is sequentially subjected to preliminary baking, ultraviolet irradiation, and main baking to form the hard coat layer 7 (step S21).

As described above, the layered structure itself of the optical stack 101 is completed through the steps of stacking the resin layer 1, the optical compensation layer 4, the polarizer 6, and the hard coat layer 7 in this order from the panel side of the display device. At this time, however, the resin layer 1 is in a state of being disposed on the glass substrate 50. Finally (after providing the hard coat layer 7), a surface of the glass substrate 50 is irradiated with a laser to peel the resin layer 1 from the glass substrate 50 (what is called laser lift-off: step S22) as illustrated in (b) of FIG. 2. The optical stack 101 is completed through step S22.

The optical stack 101 is easily produced in a sheet-by-sheet manner (i.e., one or only a few optical stacks 101 are produced at a time); thus, there is no need to handle a long rolled resin film when the optical stack 101 is produced. Accordingly, the optical stack 101 is easily produced also by a manufacturer that does not have a manufacturing apparatus suitable for handling a long rolled resin film. Thus, the optical stack 101 is easily produced. Additionally, according to the method for producing the optical stack 101, it is easy to produce the optical stack 101 in a sheet-by-sheet manner; thus, it is suitable for the individual production of the optical stack 101.

Figure 3A:
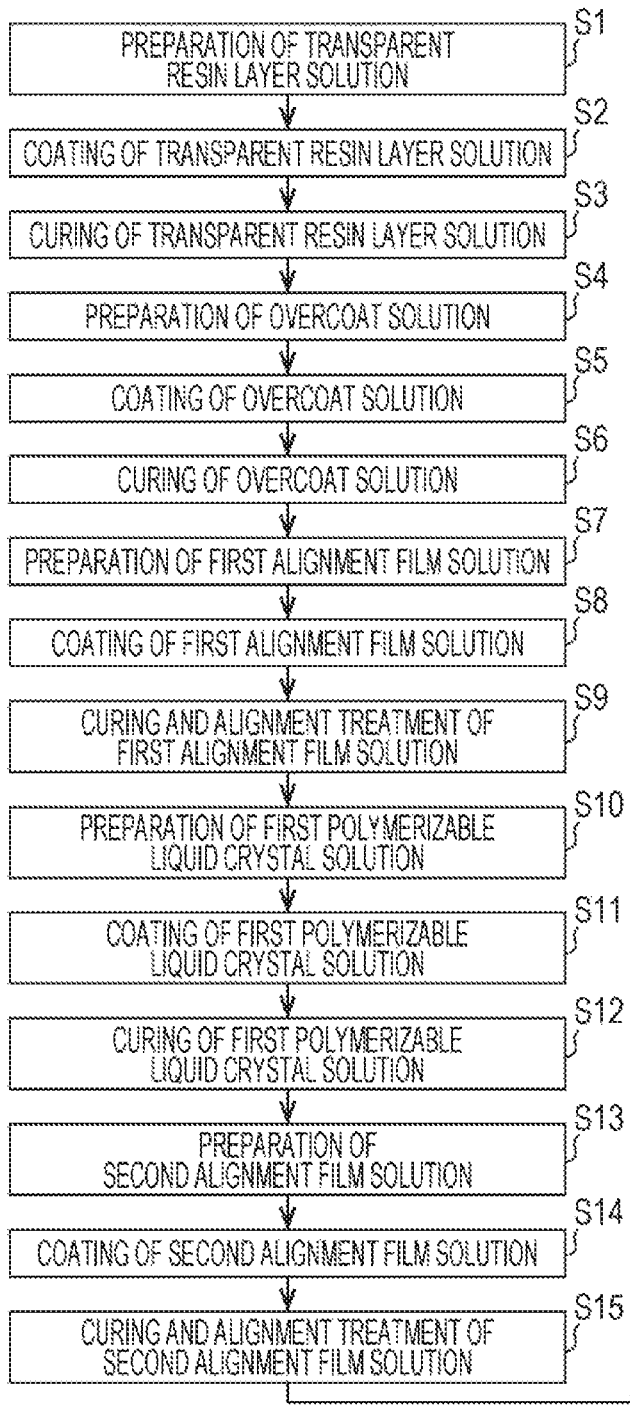
FIG. 3A is a flow chart illustrating a method for producing an optical stack according to a second embodiment of the present invention.
Figure 3B:
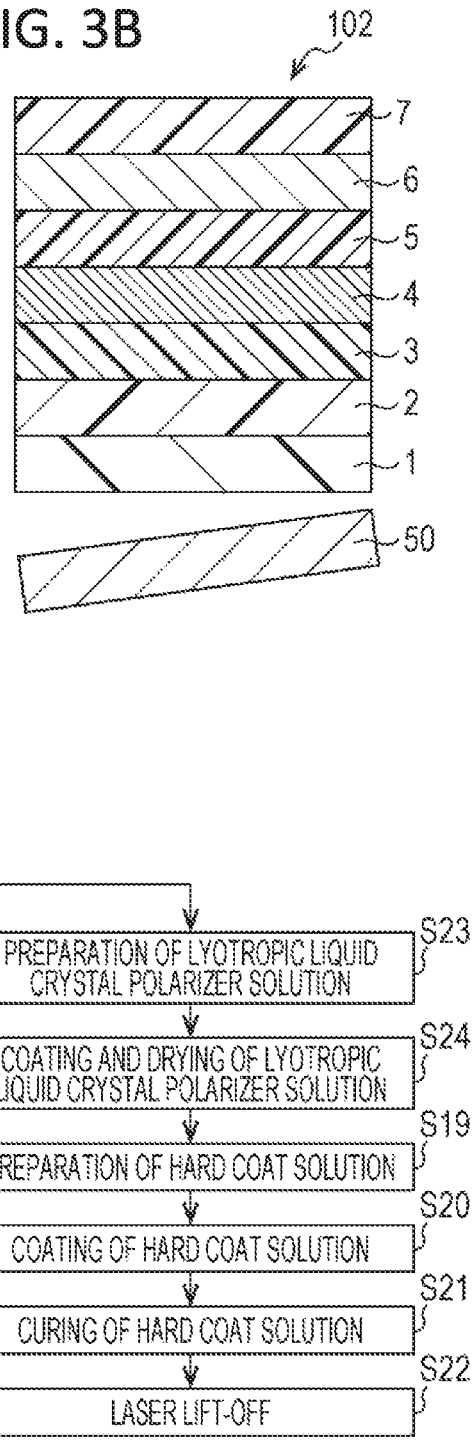
FIG. 3B is a schematic view illustrating the peeling of a resin layer of the optical stack from a glass substrate.

Second Embodiment (a) of FIG. 3 is a flow chart illustrating a method for producing an optical stack 102 according to a second embodiment of the present invention, and (b) of FIG. 3 is a schematic view illustrating the peeling of the resin layer 1 of the optical stack 102 from the glass substrate 50.

The optical stack 102 differs from the optical stack 101 in the material of the polarizer 6. That is, as a material for the polarizer 6 of the optical stack 101, the dichroic pigment-containing polymerizable liquid crystal or the like has been exemplified. Meanwhile, as a material for the polarizer 6 of the optical stack 102, a material containing a lyotropic liquid crystal material is used.

The method for producing the optical stack 102 is the same as the method for producing the optical stack 101, except that step S23 and step S24 are performed in place of step S16 to step S18. In step S23, a lyotropic liquid crystal polarizer solution is prepared. In step S24, the lyotropic liquid crystal polarizer solution is applied to the alignment film 5 by a known coating technique, such as bar coating or slit coating, in which shear stress is applied, thereby forming a coating film. After removing the solvent from the coating film, air drying is performed at normal temperature to form the polarizer 6.

Third Embodiment (a) and (b) of FIG. 4 are each a cross-sectional view illustrating the structure of an optical stack 103 according to a third embodiment of the present invention, (a) illustrates a schematic structure, and (b) is a specific structure.

The optical stack 103 includes a decorative print 8 in addition to the structure of the optical stack 102. The decorative print 8 is provided in the optical stack 103 in accordance with the type of electronic apparatus on which a display device including the optical stack 103 is mounted. The decorative print 8 is provided between the resin layer 1 and the optical compensation layer 4, more specifically, between the resin layer 1 and the overcoat layer 2. The decorative print 8 is composed of, for example, a black ink of a known pigment or dye ink. Examples of a technique for providing the decorative print 8 include ink jet methods and flexographic printing methods. The position where the decorative print 8 is provided is not limited to the above, and may be a freely-selected position between the resin layer 1 and the hard coat layer 7.

(a) of FIG. 5 is a flow chart illustrating a method for producing the optical stack 103, and (b) of FIG. 5 is a schematic view illustrating the peeling of the resin layer 1 of the optical stack 103 from the glass substrate 50.

The method for producing the optical stack 103 is the same as the method for producing the optical stack 102, except that step S25 and step S26 are performed between step S3 and step S4. In step S25, a black decorative ink is prepared. In step S26, as the decorative print 8, the black decorative ink is applied between the resin layer 1 and the optical compensation layer 4 (more specifically, between the resin layer 1 and the overcoat layer 2) by printing. The execution timings of step S25 and step S26 are not particularly limited as long as the decorative print 8 is provided on or above the resin layer 1 before step S19, which is the first step in order to dispose the hard coat layer 7.

Fourth Embodiment (a) and (b) of FIG. 6 are each a cross-sectional view illustrating the structure of an optical stack 104 according to a fourth embodiment of the present invention, (a) illustrates a schematic structure, and (b) illustrates a specific structure.

The optical stack 104 includes a touch panel electrode layer 9 in addition to the structure of the optical stack 102. The touch panel electrode layer 9 is disposed between the resin layer 1 and the optical compensation layer 4, more specifically, between the resin layer 1 and the overcoat layer 2. The touch panel electrode layer 9 includes an insulating layer 10, multiple first touch panel electrodes (electrodes) 11, and multiple second touch panel electrodes (electrodes) 12. The touch panel electrode layer 9 includes touch panel electrodes having a two-layer structure in which the first touch panel electrodes 11 and the second touch panel electrodes 12 are disposed at different layers from each other. The position where the touch panel electrode layer 9 is disposed is not limited to the above, and may be, for example, a position between the overcoat layer 2 and the alignment film 3. Additionally, an overcoat layer may be further added between the overcoat layer 2 and the alignment film 3, and the touch panel electrode layer 9 may be disposed between the added overcoat layer and the overcoat layer 2.

The first touch panel electrodes 11 and the second touch panel electrodes 12 are each an electrode to drive a touch panel. Examples of a material for each of the first touch panel electrodes 11 and the second touch panel electrodes 12 include ITO (indium tin oxide) and metals. The insulating layer 10 is disposed in order to insulate the first touch panel electrodes 11 from the second touch panel electrodes 12.

The optical stack 104 can be effectively used to drive the touch panel.

(a) of FIG. 7 is a flow chart illustrating a method for producing the optical stack 104, and (b) of FIG. 7 is a schematic view illustrating the peeling of the resin layer 1 of the optical stack 104 from the glass substrate 50.

The method for producing the optical stack 104 is the same as the method for producing the optical stack 102, except that step S27 to step S29 are performed between step S3 and step S4. In step S27, the first touch panel electrodes 11 are formed on the resin layer 1. In step S28, the insulating layer 10 is formed so as to cover the first touch panel electrodes 11. In step S29, the second touch panel electrodes 12 are formed on the insulating layer 10. In the case where the touch panel electrode layer 9 is disposed between the overcoat layer 2 and the alignment film 3 or where the touch panel electrode layer 9 is disposed between the added overcoat layer and the overcoat layer 2, the execution timings of step S27 to step S29 are next to step S6.

Fifth Embodiment

Let us consider the case where the optical stack 101 is bonded to the panel of an OLED display device and used. Unlike a structure in which a transparent polyimide is position closer to a viewer than the circular polarizer, in the case of the optical stack 101, the resin layer 1 is disposed between the panel and the optical compensation layer 4 and the polarizer 6. Thus, in the case where the phase difference is not zero, the phase difference of the optical compensation layer 4 is substantially increased or decreased, thereby failing to provide a desired circularly polarized state. As a material for the resin layer 1, a transparent polyimide with a small phase difference is preferably used. It is preferable to adjust the phase difference of the optical compensation layer 4 in consideration of the phase difference of the polyimide. For example, if the resin layer 1 has a phase difference of 40 nm, in the case where the phase difference of the optical compensation layer 4 is adjusted to 100 nm and where they are stacked in a relative relationship such that their slow axes are parallel to each other, the combined effective phase difference is exactly $\lambda/4$. Alternatively, similar results can be obtained by adjusting the phase difference of the optical compensation layer 4 to 180 nm and then stacking the layers in a relative relationship such that their slow axes are orthogonal to each other. Regarding this point, the same is true for the optical stack 102 to the optical stack 104 as in the optical stack 101.

In consideration of the above points, an optical stack having an optimized phase difference of the optical compensation layer 4 and an optimized layered structure with respect to the optical stack 101 is defined as an optical stack according to the fifth embodiment of the present invention.

Comparative Example 1

As a comparative example for each of the optical stack 101 to the optical stack 104 and the optical stack according to the fifth embodiment of the present invention, an optical stack 301 according to Comparative example 1 was produced.

Figure 8A:
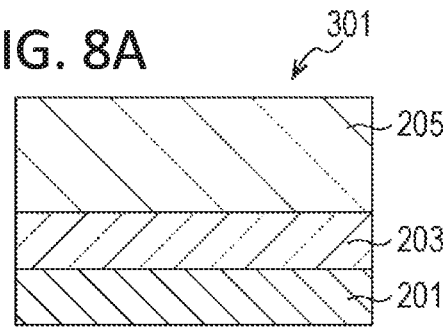
FIG. 8A and FIG. 8B are each a cross-sectional view illustrating the structure of an optical stack according to Comparative example 1.
Figure 8B:
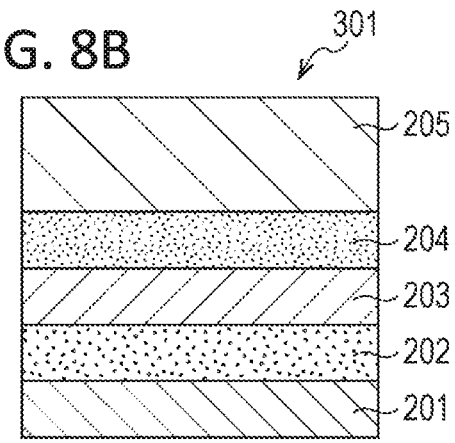

(a) and (b) of FIG. 8 are each a cross-sectional view illustrating the structure of the optical stack 301, (a) illustrates a schematic structure, and (b) illustrates a specific structure.

The optical stack 301 is an optical stack disposed on the panel of a display device and includes an optical compensation layer 201, a polarizer 203, and a cover glass 205 stacked in this order from the panel side. More specifically, the optical compensation layer 201, an optical adhesive 202, the polarizer 203, an optical adhesive 204, and the cover glass 205 are stacked in this order.

The optical compensation layer 201 is a well-known λ/4 wave plate. The optical adhesive 202 is an adhesive to bond the optical compensation layer 201 and the polarizer 203 together. The polarizer 203 is a well-known linear polarizer. The optical adhesive 204 is an adhesive to bond the polarizer 203 and the cover glass 205 together. An example of a material for each of the optical adhesive 202 and the optical adhesive 204 is OCA (optical adhesive).

Comparative Example 2

As a comparative example for each of the optical stack 101 to the optical stack 104 and the optical stack according to the fifth embodiment of the present invention, an optical stack 501 according to Comparative example 2 was produced.

Figure 9A:
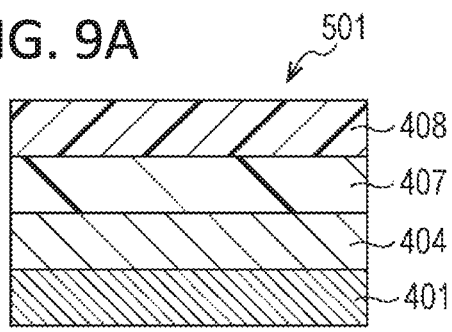
FIG. 9A and FIG. 9B are each a cross-sectional view illustrating the structure of an optical stack according to Comparative example 2.
Figure 9B:
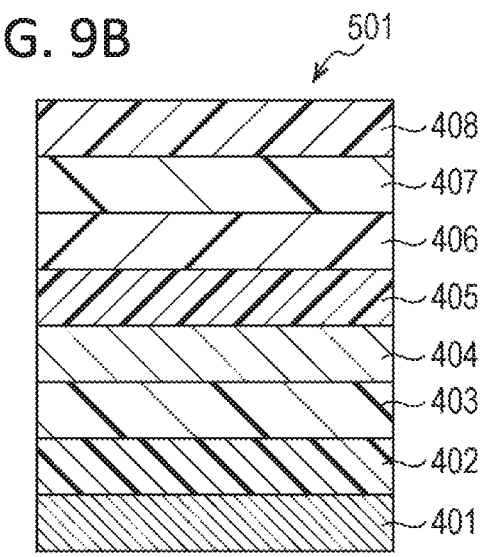

(a) and (b) of FIG. 9 are each a cross-sectional view illustrating the structure of the optical stack 501, (a) illustrates a schematic structure, and (b) illustrates a specific structure.

The optical stack 501 is an optical stack disposed on the panel of a display device and includes an optical compensation layer 401, a polarizer 404, a resin layer 407, and a hard coat layer 408 stacked in this order from the panel side. More specifically, the optical compensation layer 401, an alignment film 402, an overcoat layer 403, the polarizer 404, an alignment film 405, an overcoat layer 406, the resin layer 407, and the hard coat layer 408 are stacked in this order.

Figure 10:
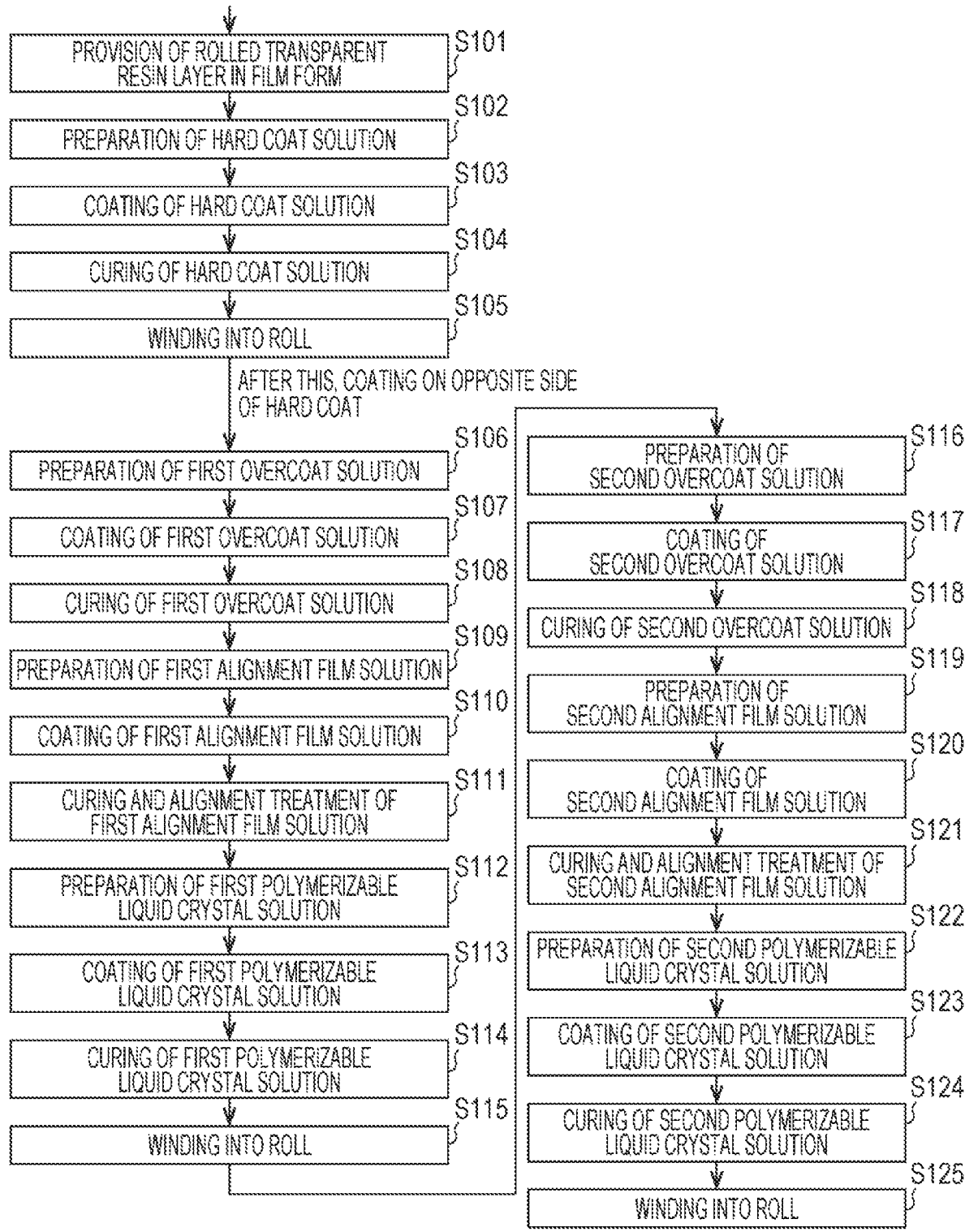
FIG. 10 is a flow chart illustrating a method for producing an optical stack according to Comparative example 2.

FIG. 10 is a flow chart illustrating a method for producing the optical stack 501.

First, a long rolled film-like transparent resin layer is provided and is used as the resin layer 407 (step S101).

Then a hard coat solution is prepared (step S102). The hard coat solution is applied to one surface of the resin layer 407 (step S103). The hard coat solution is then cured (step S104). The hard coat layer 408 is formed through step S104.

Next, the film formed in step S104 is wound into a roll (step S105).

Subsequently, a first overcoat solution is prepared (step S106). The first overcoat solution is applied to the other surface of the resin layer 407 (step S107). The first overcoat solution is then cured (step S108). The overcoat layer 406 is formed through step S108.

Next, a first alignment film solution is prepared (step S109). The first alignment film solution is applied to the overcoat layer 406 (step S110). The first alignment film solution is cured and is further subjected to alignment treatment (step S111). The alignment film 405 is formed through step S111.

Subsequently, a first polymerizable liquid crystal solution is prepared (step S112). The first polymerizable liquid crystal solution is applied to the alignment film 405 (step S113). The first polymerizable liquid crystal solution is then cured (step S114). The polarizer 404 is formed through step S114.

Next, the film formed in step S114 is wound into a roll (step S115).

Subsequently, a second overcoat solution is prepared (step S116). The second overcoat solution is applied to the polarizer 404 (step S117). The second overcoat solution is then cured (step S118). The overcoat layer 403 is formed through step S118.

Next, a second alignment film solution is prepared (step S119). The second alignment film solution is applied to the overcoat layer 403 (step S120). The second alignment film solution is cured and is further subjected to alignment treatment (step S121). The alignment film 402 is formed through step S121.

Subsequently, a second polymerizable liquid crystal solution is prepared (step S122). The second polymerizable liquid crystal solution is applied to the alignment film 402 (step S123). The second polymerizable liquid crystal solution is then cured (step S124). The optical compensation layer 401 is formed through step S124.

Next, the film formed in step S124 is wound into a roll (step S125).

The flow chart presented in FIG. 10 is an example in which the number of times the film is wound into a roll is minimized. For example, it is also conceivable to add a step of winding the film into a roll at at least one of intervals between step S108 and step S109, between step S111 and step S112, between step S118 and step S119, and between step S121 and step S122. In particular, when a manufacturer does not have a manufacturing apparatus capable of continuously implementing two or more steps in a roll state or when an inspection step is intended to be performed after each step, the number of times the film is wound into a roll is increased, in some cases.

FIG. 11 is a table presenting the thickness, the flexibility, the additional function, and the appearance quality (specularity) of the optical stacks according to the embodiments and the comparative examples of the present invention.

In the table, the terms "EXAMPLE 1" to "EXAMPLE 5" and "COMPARATIVE EXAMPLE 1" and "COMPARATIVE EXAMPLE 2" indicate the following.

EXAMPLE 1: optical stack 101
EXAMPLE 2: optical stack 102
EXAMPLE 3: optical stack 103
EXAMPLE 4: optical stack 104
EXAMPLE 5: optical stack according to fifth embodiment of the present invention
COMPARATIVE EXAMPLE 1: optical stack 301
COMPARATIVE EXAMPLE 2: optical stack 501

In the additional function column in the table, the term "DECORATIVE PRINT" indicates that the decorative print 8 is provided. The term "TOUCH PANEL" indicates that a touch panel function is provided (that is, the first touch panel electrodes 11 and the second touch panel electrodes 12 are provided). Additionally, the appearance quality (specularity) column in the table is marked with O when the appearance has a desired quality. The appearance quality (specularity) column is marked with x when the appearance does not have a desired quality. As the evaluation criterion of the appearance, when there are only a few wrinkles, it is evaluated as O.

The table indicates that the appearance quality of each of the optical stack 101 to the optical stack 104 and the optical stack according to the fifth embodiment of the present invention, each optical stack being provided by forming the layered structure on the glass substrate 50, is higher than that of the optical stack 501 formed on the film by coating. This difference in appearance can be explained as follows: in the case of the optical stack 501 formed on the film by coating, wrinkles are formed by shrinkage during the curing of the solutions (called cure shrinkage) for the optical compensation layer 401, the alignment film 402, the overcoat layer 403, the polarizer 404, the alignment film 405, the overcoat layer 406, and the hard coat layer 408. In contrast, in the case of each of the optical stack 101 to the optical stack 104 and the optical stack according to the fifth embodiment of the present invention, each optical stack being provided by forming the layered structure on the glass substrate 50, wrinkles are not easily formed because the cure shrinkage of the solutions is inhibited on the rigid glass substrate 50.

[Regarding Display Device]

A display device including any of the optical stack 101 to the optical stack 104 and the optical stack according to the fifth embodiment of the present invention is also included in the scope of the present invention.

Figure 12:
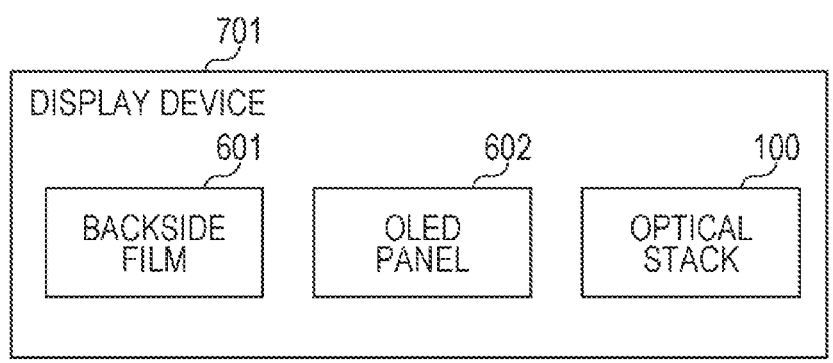
FIG. 12 is a block diagram illustrating a schematic configuration of a display device according to the present invention.

FIG. 12 is a block diagram illustrating a schematic configuration of a display device 701 according to the present invention. The display device 701 is an OLED display device including a backside film 601, an OLED panel (panel) 602, and an optical stack 100. As the optical stack 100, any of the optical stack 101 to the optical stack 104 and the optical stack according to the fifth embodiment of the present invention can be used. In the display device 701, the optical stack 100 is disposed on the OLED panel 602.

Figure 13:
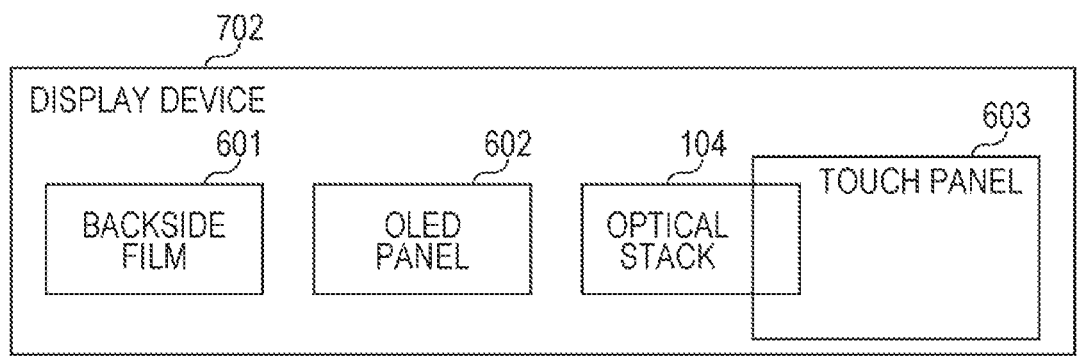
FIG. 13 is a block diagram illustrating a schematic configuration of a display device according to the present invention.

FIG. 13 is a block diagram illustrating a schematic configuration of a display device 702 according to the present invention. The display device 702 is an OLED display device including the backside film 601, the OLED panel 602, the optical stack 104, and a touch panel 603. In the display device 702, the optical stack 104 is disposed on the OLED panel 602. The touch panel 603 includes the touch panel electrode layer 9 of the optical stack 104 and is driven by the first touch panel electrodes 11 and the second touch panel electrodes 12 disposed in the optical stack 104.

The display device according to the present invention is not limited to the OLED panel and may be, for example, a liquid crystal display device.

[Gist]

According to a first aspect of the present invention, an optical stack is an optical stack disposed on the panel of a display device and includes a resin layer, an optical compensation layer, a polarizer, and a hard coat layer stacked in this order from the panel side.

According to the above configuration, the optical stack is easily produced in a sheet-by-sheet manner (i.e., one or only a few optical stacks are produced at a time); thus, there is no need to handle a long rolled resin film when the optical stack is produced. The optical stack is easily produced also by a manufacturer that does not have a manufacturing apparatus suitable for handling a long rolled resin film. Accordingly, the optical stack is easily produced.

According to a second aspect of the present invention, the polarizer of the optical stack according to the first aspect may contain a lyotropic liquid crystal material.

According to a third aspect of the present invention, the optical stack according to the first or second aspect includes a decorative print in accordance with the type of electronic apparatus on which the display device is mounted, the decorative print being formed between the resin layer and the hard coat layer.

According to the above configuration, the optical stack including the decorative print in accordance with the type of electronic apparatus can be provided.

According to a fourth aspect of the present invention, the optical stack according to any of the first to third aspects further includes an electrode to drive a touch panel, the electrode being disposed between the resin layer and the optical compensation layer.

According to the above configuration, the optical stack can be effectively used to drive the touch panel.

A display device according to a fifth aspect of the present invention includes a panel and the optical stack described above, the optical stack being disposed on the panel.

According to the above configuration, the display device has the same effect as in the optical stack.

A display device according to a sixth aspect of the present invention includes a panel, a touch panel, and the optical stack described above, the optical stack being disposed on the panel, the touch panel being driven by the electrode disposed in the optical stack.

According to the above configuration, the display device has the same effect as in the optical stack. Additionally, according to the above configuration, the optical stack can be effectively used to drive the touch panel.

A method for producing an optical stack according to a seventh aspect of the present invention is a method for producing an optical stack disposed on the panel of a display device and includes the steps of stacking a resin layer, an optical compensation layer, a polarizer, and a hard coat layer in this order from a panel side.

According to the above configuration, the optical stack according to the present invention can be easily produced.

Additionally, according to the above configuration, the method is suitable for the individual production of the optical stack because the optical stack is easily produced in a sheet-by-sheet manner.

According to an eighth aspect of the present invention, in the method for producing an optical stack according to the seventh aspect, before providing the hard coat layer, decorative printing is performed on or above the resin layer in accordance with the type of electronic apparatus on which the display device is mounted.

According to the above configuration, the optical stack including a decorative print in accordance with the type of electronic apparatus can be produced easily and suitably for individual production.

According to a ninth aspect of the present invention, in the method for producing an optical stack according to the seventh or eighth aspect, before providing the optical compensation layer, an electrode to drive a touch panel is disposed on or above the resin layer.

According to the above configuration, the optical stack that can be effectively used to drive a touch panel can be produced easily and suitably for individual production.

According to a tenth aspect of the present invention, the method for producing an optical stack according to any of seventh to ninth aspects further includes the steps of disposing the resin layer on a glass substrate and, after providing the hard coat layer, peeling the resin layer from the glass substrate.

According to the above configuration, the appearance quality can be improved by forming the layered structure of the optical stack on the glass substrate.

The present invention is not limited to the embodiments described above. Various modifications can be made within the scope of Claims. An embodiment obtained by appropriately combining technical means disclosed in different embodiments is also included in the technical scope of the present invention. A combination of the technical means disclosed in the embodiments can form a new technical feature.

What is claimed is:

1. A display device, comprising:
an organic light-emitting diode (OLED) panel, an optical stack to compensate for light that is internally reflected within the OLED panel, and a touch panel;
the display device including in order from a viewing side the optical stack comprising a hard coat layer, a polarizer, a first alignment film, a λ/4 wave plate, and a second alignment film; and the touch panel, a resin layer, and the OLED panel; and
the touch panel including an electrode for driving the touch panel, and the electrode being disposed between the λ/4 wave plate and the resin layer;
wherein the polarizer includes a first polymerized liquid crystal that is aligned by the first alignment film, and the λ/4 wave plate includes a second polymerized liquid crystal that is aligned by the second alignment film.

2. The display device according to claim 1, wherein the resin layer is made of polyimide.

3. The display device according to claim 1, wherein a slow axis of the resin layer and a slow axis of the λ/4 wave plate are parallel to each other.

4. The display device according to claim 1, wherein a slow axis of the resin layer and a slow axis of the λ/4 wave plate are orthogonal to each other.

5. The display device according to claim 1, wherein an uppermost surface of the display device is the hard coat layer.

6. The display device according to claim 1, wherein an over coat layer is disposed on the touch panel.

7. The display device according to claim 1, further comprising a decorative print between the resin layer and the hard coat layer.

8. The display device according to claim 1, wherein the first polymerized liquid crystal contains a material different from that of the second polymerized liquid crystal, and the first polymerized liquid crystal contains a dichroic pigment.

* * * * *